US012637753B2

(12) United States Patent
　　Korenstein et al.

(10) Patent No.: US 12,637,753 B2
(45) Date of Patent: May 26, 2026

(54) METHOD FOR PRODUCING TRANSPARENT CONDUCTIVE COATINGS FOR EMI PROTECTION USING HiPIMS

(71) Applicant: Raytheon Company, Arlington, VA (US)

(72) Inventors: Ralph Korenstein, Natick, MA (US); Troy R. Taylor, Windham, NH (US)

(73) Assignee: Raytheon Company, Arlington, VA (US)

( * ) Notice: Subject to any disclaimer, the term of this patent is extended or adjusted under 35 U.S.C. 154(b) by 0 days.

(21) Appl. No.: 18/604,125

(22) Filed: Mar. 13, 2024

(65) Prior Publication Data

US 2025/0294715 A1　　Sep. 18, 2025

(51) Int. Cl.
　　*C23C 14/06*　　　　(2006.01)
　　*C23C 14/00*　　　　(2006.01)
　　　　　　(Continued)

(52) U.S. Cl.
　　CPC ...... *C23C 14/0629* (2013.01); *C23C 14/0084* (2013.01); *C23C 14/14* (2013.01);
　　　　　　(Continued)

(58) Field of Classification Search
　　CPC . C23C 14/0629; C23C 14/14; C23C 14/3485; C23C 14/35; C23C 14/352;
　　　　　　(Continued)

(56) References Cited

U.S. PATENT DOCUMENTS 4,389,295 A　*　6/1983　Davey ..................... H01J 9/221
　　　　　　　　　　　　　　　　　　　　204/298.26
4,704,339 A　　11/1987　Green et al.
　　　　　　(Continued)

FOREIGN PATENT DOCUMENTS

CN　　102610690　　7/2012
CN　　106435493　　2/2017
　　　　(Continued)

OTHER PUBLICATIONS

"Zhuk, S.; Wong, T.; Hadke, S.; Lie, S.; Guchhait, A.; Gao, Y.; Wong, L.; Cheng, S.; Wang, X.; Dalapati, G. Molybdenum incorporated Cu1.69ZnSnS4 kesterite photovoltaic devices with bilayer microstructure and tunable optical-electronic properties". Journal of Solar Energy 194, p. 777-787. (Year: 2019).*

(Continued)

*Primary Examiner* — Michael A Band

(74) *Attorney, Agent, or Firm* — Schwegman Lundberg & Woessner, P.A.

(57)　　　　　　ABSTRACT

A method for forming a coating on a substrate formed from zinc sulfide (ZnS) is provided. A ZnS film is grown on the substrate with a radio frequency sputtering process and metal dopants are sputtered on the substrate with a high-power impulse magnetron sputtering process. The metal dopants can be molybdenum or tungsten and simultaneously sputtered while growing the ZnS film. The sputtering ionizes the coating where the coating has a sheet resistance that is less than 50 ohm/square and the metal dopants form n-type dopants in the ZnS film. The metal dopants can be formed at a concentration that varies with a thickness of the ZnS film. At a first thickness, the concentration is at a first concentration and at a second thickness greater than the first thickness, the concentration is at a second concentration less than the first concentration.

7 Claims, 5 Drawing Sheets

(51) Int. Cl.

| | |
|---|---|
| *C23C 14/14* | (2006.01) |
| *C23C 14/34* | (2006.01) |
| *C23C 14/35* | (2006.01) |
| *H01J 37/34* | (2006.01) |

(52) U.S. Cl.
CPC ........ *C23C 14/3485* (2013.01); *C23C 14/352* (2013.01); *H01J 37/3426* (2013.01); *H01J 37/3467* (2013.01); *C23C 14/35* (2013.01)

(58) Field of Classification Search
CPC .............. C23C 14/3464; H01J 37/3426; H01J 37/3467; H05K 9/0084
See application file for complete search history.

(56) References Cited

U.S. PATENT DOCUMENTS

| | | | |
|---|---|---|---|
| 4,939,043 | A | 7/1990 | Biricik et al. |
| 5,122,424 | A | 6/1992 | Chaffin, III |
| 5,173,443 | A | 12/1992 | Biricik et al. |
| 6,007,908 | A | 12/1999 | Reece et al. |
| 6,160,661 | A | 12/2000 | Klocek et al. |
| 7,147,759 | B2 | 12/2006 | Chistyakov |
| 7,161,173 | B2 | 1/2007 | Burgener, II et al. |
| 8,044,477 | B1 | 10/2011 | Zhong et al. |
| 9,123,508 | B2 * | 9/2015 | Chistyakov ......... H01J 37/3408 |
| 9,952,355 | B1 | 4/2018 | Schwartz |
| 10,692,707 | B2 | 6/2020 | Weichart et al. |
| 10,741,649 | B2 | 8/2020 | Sachet et al. |
| 2002/0096684 | A1 | 7/2002 | Brandes et al. |
| 2003/0077401 | A1 | 4/2003 | Dodonov et al. |
| 2003/0201164 | A1 | 10/2003 | Johnson et al. |
| 2004/0235214 | A1 | 11/2004 | Burgener et al. |
| 2006/0118406 | A1 | 6/2006 | Delahoy et al. |
| 2010/0055826 | A1 | 3/2010 | Zhong et al. |
| 2010/0072465 | A1 | 3/2010 | Frantz et al. |
| 2010/0264016 | A1 | 10/2010 | Anders et al. |
| 2010/0282319 | A1 | 11/2010 | Taliani et al. |
| 2011/0067998 | A1 | 3/2011 | Barry |
| 2012/0000765 | A1 | 1/2012 | Halloran |
| 2012/0000767 | A1 | 1/2012 | Halloran |
| 2012/0067421 | A1 | 3/2012 | Shao et al. |
| 2012/0080306 | A1 | 4/2012 | Zhong et al. |
| 2012/0164051 | A1 | 6/2012 | Bruns et al. |
| 2012/0168742 | A1 | 7/2012 | Frantz et al. |
| 2012/0180858 | A1 | 7/2012 | Zhong et al. |
| 2012/0205540 | A1 | 8/2012 | Ravichandran et al. |
| 2012/0223230 | A1 | 9/2012 | Ravichandran et al. |
| 2015/0315697 | A1 | 11/2015 | Chistyakov et al. |
| 2015/0380600 | A1 | 12/2015 | Buller et al. |
| 2017/0022368 | A1 | 1/2017 | Goela et al. |
| 2018/0290896 | A1 | 10/2018 | Ravichandran et al. |
| 2021/0123131 | A1 | 4/2021 | Tsai et al. |
| 2022/0244431 | A1 | 8/2022 | Riedel et al. |
| 2024/0010575 | A1 | 1/2024 | Cook et al. |
| 2025/0008715 | A1 | 1/2025 | Korenstein et al. |

FOREIGN PATENT DOCUMENTS

| | | |
|---|---|---|
| CN | 104862653 | 7/2017 |
| CN | 107119323 | 9/2017 |
| CN | 108410460 | 8/2018 |
| CN | 108754442 | 11/2018 |
| CN | 109839680 | 6/2019 |
| CN | 110205597 | 9/2019 |
| CN | 108330440 | 6/2020 |
| CN | 109097753 | 8/2020 |
| CN | 113073300 | 7/2021 |
| CN | 114645251 | 6/2022 |
| CN | 115433906 | 8/2023 |
| EP | 4035211 | 8/2022 |
| JP | S61133825 | 6/1986 |
| JP | S63201078 | 8/1988 |
| JP | 2018163339 | 10/2018 |
| JP | 2022549855 | 11/2022 |
| JP | 7534056 | 8/2024 |
| RO | 129878 | 11/2014 |
| TW | I381063 | 1/2013 |
| WO | 2010051282 | 5/2010 |
| WO | 2015199624 | 12/2015 |
| WO | 2018083480 | 5/2018 |
| WO | 2021062162 | 4/2021 |

OTHER PUBLICATIONS

Derwent Abstract WO 2021062162 (Year: 2021).*

"Stepwise" definition. Oxford Language via Google Search [Accessed on Jan. 24, 2026].*

Greczynski, G., et al., "Metal-ion subplantation: A game changer for controlling nanostructure and phase formation during film growth by physical vapor deposition", J. Appl. Phys. vol. 127, Issue 18, (May 14, 2020), 21 pgs.

Li, X., et al., "Toward energy-efficient physical vapor deposition: Routes for replacing substrate heating during magnetron sputter deposition by employing metal ion irradiation", Surface and Coatings Technology, vol. 415, (Jun. 15, 2021), 10 pgs.

"Japanese Application Serial No. 2022-518968, Notification of Reasons for Refusal mailed Feb. 6, 2024", w English Translation, 8 pgs.

"Japanese Application Serial No. 2022-518968, Response filed Apr. 22, 2024 to Notification of Reasons for Refusal mailed Feb. 6, 2024", With English Machine Translation, 17 pgs.

"International Application Serial No. PCT US2020 052731, International Search Report mailed Dec. 17, 2020", 4 pgs.

"International Application Serial No. PCT US2020 052731, Written Opinion mailed Dec. 17, 2020", 7 pgs.

"International Application Serial No. PCT US2020 052731, International Preliminary Report on Patentability mailed Jul. 4, 2022", 9 pgs.

"Japanese Application Serial No. 2022-518968, Notification of Reasons for Refusal mailed Apr. 4, 2023", w English translation, 4 pgs.

"Japanese Application Serial No. 2022-518968, Notification of Reasons for Refusal mailed Aug. 8, 2023", w English translation, 6 pgs.

"European Application Serial No. 20789394.2, Response to Communication pursuant to Rules 161(1) and 162 EPC filed Sep. 26, 2022", 13 pgs.

"European Application Serial No. 20789394.2, Communication Pursuant to Article 94(3) EPC mailed Mar. 29, 2023", 6 pgs.

"European Application Serial No. 20789394.2, Noting of loss of rights pursuant to Rule 112(1) EPC mailed Oct. 31, 2023", 2 pgs.

"U.S. Appl. No. 17/032,793, Preliminary Amendment filed Dec. 14, 2020", 4 pgs.

"U.S. Appl. No. 17/032,793, Preliminary Amendment filed Jan. 13, 2021", 3 pgs.

"U.S. Appl. No. 17/032,793, Non Final Office Action mailed Mar. 6, 2025", 10 pgs.

"Glossary Definition LWIR (Long-Wave Infrared)", [Online]. Retrieved from the Internet: https: www.infinitioptics.com glossary lwir-long-wave-infrared, (2019), 1 pg.

"U.S. Appl. No. 17/032,793, Response filed Apr. 22, 2025 to Non Final Office Action mailed Mar. 6, 2025", 9 pgs.

Yanagi, H., "P-Type Conductivity in Transparent Oxides and Sulfide Fluorides", Journal of Solid State Chemistry vol. 175, No. 1, (Oct. 1, 2003), 5 pgs.

"International Application Serial No. PCT US2025 019579, International Search Report mailed Jun. 30, 2025", 4pages.

"International Application Serial No. PCT US2025 019579, Written Opinion mailed Jun. 30, 2025", 6 pages.

Axelevitch, Alexander, "Preparation and study of doped ZnS thin films", Microelectronic Engineering, Elsevier Publishers BV., Amsterdam, NL, vol. 170, XP029891366, ISSN: 0167-9317, DOI: 10.1016 J. MEE.2016.12.027, (Dec. 29, 2016), 5 pages.

"U.S. Appl. No. 17/032,793, Notice of Allowance mailed Jul. 11, 2025", 11 pgs.

"U.S. Appl. No. 17/032,793, Corrected Notice of Allowability mailed Jul. 17, 2025", 3 pgs.

(56)         References Cited

OTHER PUBLICATIONS

"U.S. Appl. No. 17/032,793, Supplemental Notice of Allowability mailed Aug. 19, 2025", 3 pgs.

* cited by examiner

METHOD FOR PRODUCING TRANSPARENT CONDUCTIVE COATINGS FOR EMI PROTECTION USING HiPIMS

TECHNICAL FIELD

Examples relate to a coating for coating for a substrate and more specifically to an ionized coating that provides electromagnetic interference (EMI) protection and a conductor for radio frequency (RF) signals.

BACKGROUND

Zinc sulfide (ZnS) can be used for windows in vehicles that can be used in hostile environments. ZnS can have favorable transmission characteristics in the visible through infrared wavebands. Thus, ZnS can be used for detectors that detect targets for data acquisition using optical signals and thermal signatures. However, when vehicles are in hostile environments, the vehicles can be subjected to heavy EMI. EMI can obscure detection capabilities of the detector. In order to minimize interference from EMI, metal grids can be placed over the windows. However, the metal grids can introduce different problems that can affect optical and heat signature detection. In particular, the metal grid can obscure optical and thermal signatures, diffract optical signatures, and cause backscatter of incoming optical signatures. Thus, the metal grids can minimize detection capabilities.

DETAILED DESCRIPTION

The following description and the drawings sufficiently illustrate teachings to enable those skilled in the art to practice them. Other embodiments may incorporate structural, logical, electrical, process, and other changes. Portions and features of some examples may be included in, or substituted for, those of other examples. Teachings set forth in the claims encompass all available equivalents of those claims.

Examples relate to a single layer coating for a surface of a substrate, such as a ZnS window. The coating can be formed on the substrate by using a high-power impulse magnetron sputtering (HiPIMS) process that sputters a metal dopant, such as molybdenum or tungsten, on the substrate. The HiPIMS process ionizes the metal dopant when the metal dopant is deposited onto the substrate. During sputtering of the metal dopant, RF magnetron sputtering is used to sputter a substrate material that is the same as the material for the substrate onto the substrate in order to grow a substrate material film. By virtue of co-sputtering the metal dopant along with the substrate material, the metal dopant can be incorporated into a growing film of the substrate material on a surface of the substrate. Moreover, since the metal dopant is ionized, the metal dopant can add electrons to the substrate material, which can result in an n-type conductor with a carrier concentration ranging from $10^{16}$ cm$^{-3}$ to $10^{22}$ cm$^{-3}$. In examples, the conductor can be a transparent conductor. The doped coating can minimize EMI interference that can be subjected to the substrate while still allowing for detection of optical and thermal signatures by a detector.

In further examples, the substrate itself can be activated with RF energy. While the substrate is being activated, the metal dopant can be deposited onto the activated substate using a HiPIMS process.

Figure 1:
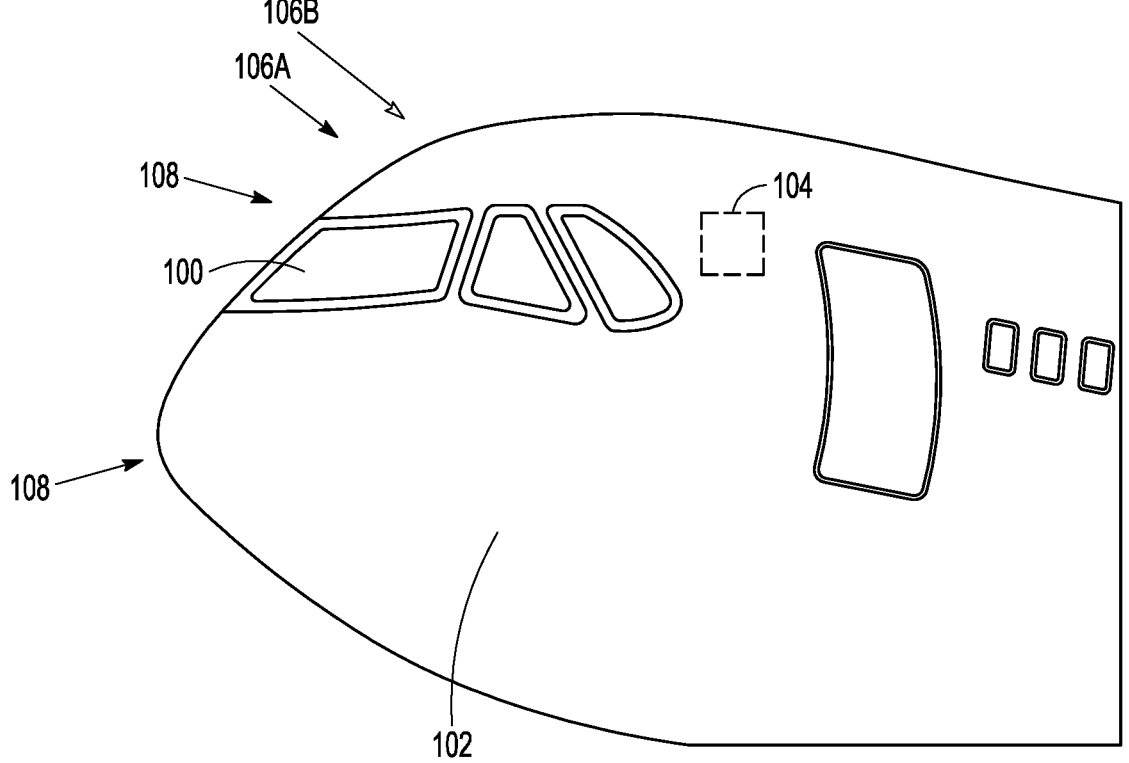
FIG. 1 illustrates a vehicle having a substrate that can minimize EMI while at the same time allowing for the detection of optical and heat signatures.
Figure 2:
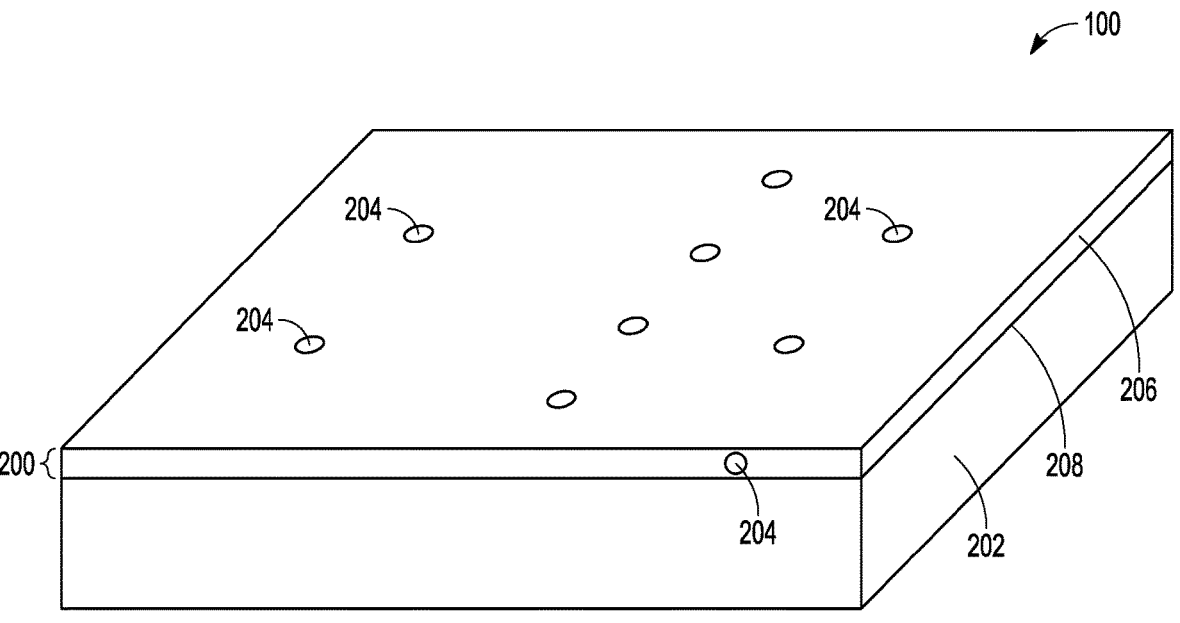
FIG. 2 illustrates a coating that can be disposed on the substrate shown in FIG. 1.

Now making reference to FIG. 1, a structure 100, which can be a window for a vehicle 102, such as an aircraft, is shown. While an aircraft is shown, examples envision any type of vehicle. Regardless of the type of vehicle, a detector 104 can be mounted inside the vehicle 102, which can receive optical signals through the substrate 100. Moreover, the detector can detect optical and thermal signatures through the substrate 100. Examples of the detector 102 can include detectors that are sensitive to IR radiation, such as indium antimonide detectors and mercury cadmium telluride detectors. The structure 100 can be formed from ZnS. While ZnS has favorable optical transmission properties, ZnS can have conductive properties that are not as favorable as the optical transmission properties. Thus, as will be discussed further below, the structure 100 can be formed in order to allow the detector 104 to detect optical signals 106A through the structure 100 while at the same time minimizing EMI 108 that can obscure the detection capabilities of the detector 104. Moreover, the substrate can allow for the detection of signatures 106B therethrough while minimizing EMI 108. The signatures can be thermal signatures.

To facilitate this functionality, the window 100 can include a coating 200 that is disposed on a substrate 202. The coating 200 can include metal dopants 204 that can be deposited such that the metal dopants 204 are ionized and provide conductance capabilities for the structure 100 based on the carrier concentration in the structure crated during implantation of the metal dopants 204. The coating 200 can also include a ZnS film 206 that can be grown on a surface 208 of the substrate 200. The coating 200 can be transparent, which, along with the substrate 202 being transparent, can allow for optical signal detection through the structure 100. In further examples, both the coating 200 and the substrate 202 can be opaque. Moreover, the coating 200 can allow for thermal detection therethrough. To ease the discussion, the sizes and thicknesses of the coating 200 and the metal dopants 204 are exaggerated. By virtue of being ionized, the metal dopants 204 can provide shielding from the EMI 108 for the vehicle 102 and the detector 104. Furthermore, since the metal dopants 204 are ionized, the metal dopants 204 can facilitate the detection of the optical signals 106A. More specifically, the metal dopants 204 can provide conductive capabilities for the coating 200, which can provide shielding from the EMI 108 while simultaneously facilitating the detection of optical signals 106A from the detector 104 while allowing for the passage of the signatures 106B into an interior of the vehicle 102.

Figure 3:
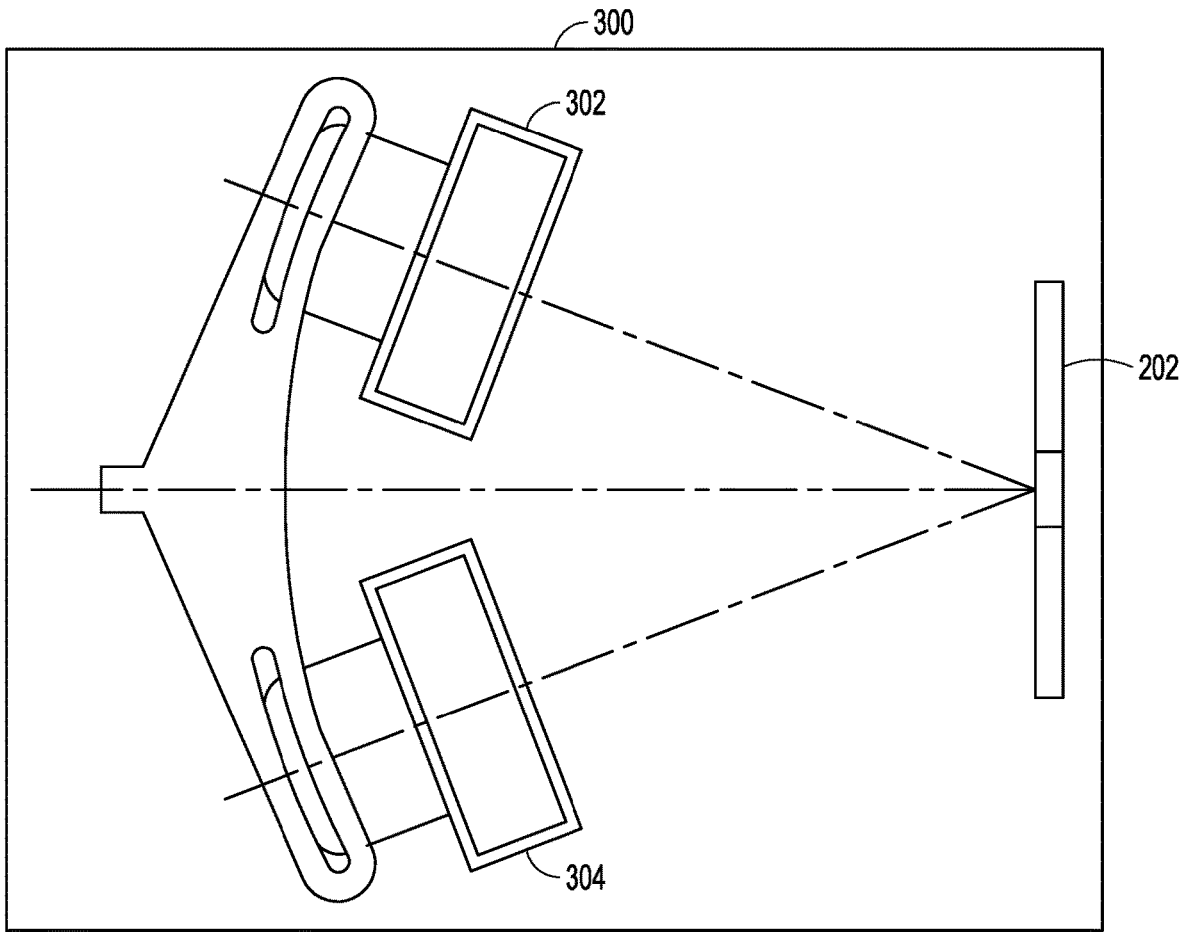
FIG. 3 shows a coating device that can be used to form the coating of FIG. 2.

The structure 100 can be formed by first providing the substrate 202 and then forming the coating 200 over the substrate 202, as shown with reference to FIG. 3. The substrate 202 can be provided in a coating device 300, such as a deposition chamber, where different types of deposition processes can be performed. For example, RF sputtering processes and HiPIMS processes can be performed within the coating device 300.

During RF sputtering, a high-voltage alternating current (A/C) power source can send radio waves through a vacuum chamber of the coating device 300. The radio waves can create ionized gas ions that can impact a target 302. The target 302 can include ZnS. When the ionized gas particles impact the target 302, atoms from the target can create a fine mist that can cover the substrate 202.

A HiPIMS process can work by providing a large energy impulse to a cathode over a short period of time where high-power density is provided to a target 304 in short impulses. Degrees of ionization of metal sputtered from the target 304 and a rate of molecular gas dissociation can be controlled based on a peak power level of the cathode. HiPIMS processes can create a high-density plasma of the metal that is sputtered from the target 304. In examples, the target 304 can include a metal that corresponds to the dopant 204, such as molybdenum and tungsten. In addition to molybdenum and tungsten, other metals that can be used for the dopant 204 can include heavy metals, such as zirconium, tantalum.

By virtue of using a HiPIMS process, the metal dopants 204 can be ionized, therefore providing conductive properties to the substrate 100, such as providing shielding from the EMI 108 while simultaneously facilitating the detection of the optical signals 106A and the detection of the signatures 106B. Moreover, the metal dopants 204 can be ionized such that the metal dopants 204 are n-type dopants. In further examples, the metal dopants 204 can be ionized such that the metal dopants 204 are p-type dopants as an additional coating to the structure 100.

An RF sputtering process and a HiPIMS process can be simultaneously performed such that as the ZnS film 206 is grown on the substrate 202 during a RF sputtering process, a HiPIMS process can also be performed where the metal dopants 204 that are ionized can be interspersed in the ZnS film 206 as the ZnS film 206 is grown on the substrate 202. The grown ZnS film 206 that is interspersed with the metal dopants 204 can form the coating 200.

Alternatively, instead of providing RF energy to the target 302 as mentioned above, RF energy could be directed to the substrate 202 in order to activate the substrate 202. During activation and scattering of the ZnS atoms as RF energy is directed to the substrate 202, the metal dopants 204 can be provided to the substrate 202 via the HiPIMS process discussed above. Sputtering the metal dopants 204 on the substrate 202 as ZnS atoms are activated during an RF process can create the coating 200 having the properties discussed herein. Furthermore, by virtue of this process, implantation of the metal dopants 204 into the substrate 202 can occur.

Regardless of the technique used to form the coating 200, in examples, the metal dopants 204 can be formed to have a concentration that varies according to a thickness of the ZnS film 206 that is formed on the substrate 202. In examples where the coating 200 has a thickness in a range between about 0.1 microns and about 1 micron, the carrier concentration produced by the metal dopant 204 can be in a range between about $1 \times 10^{18}$ cm$^{-3}$ and about $1 \times 10^{20}$ cm$^{-3}$. Moreover, the coating 200 can have a sheet resistance in a range of about 25 ohms/square to about 50 ohms/square.

In further examples, the ZnS film 206 of the coating 200 can be formed in a stepwise fashion where the ZnS film 206 can be formed to have a thickness that is in a range between about 20 microns and about 30 microns. In this example, the concentration of the metal dopant 204 can be in a range between about $1 \times 10^{16}$ cm$^{-3}$ and $1 \times 10^{17}$ cm$^{-3}$. Here, the greater thickness of the ZnS film 206 can allow for a lower concentration of the metal dopant 204 since the greater thickness of the ZnS film 206 can dilute the metal dopant 204 throughout the coating 200.

Figure 4:
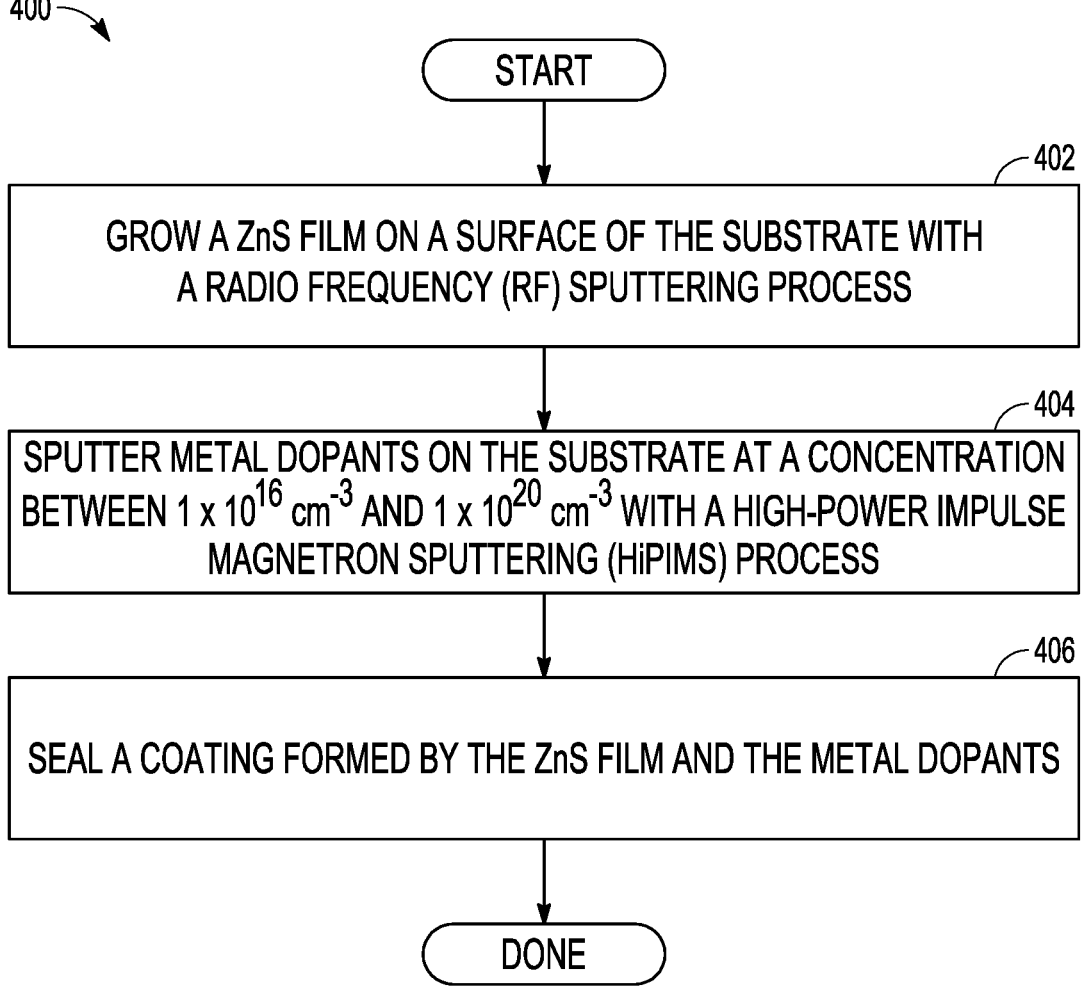
FIG. 4 illustrates a method for forming a coating on a substrate.
Figure 5:
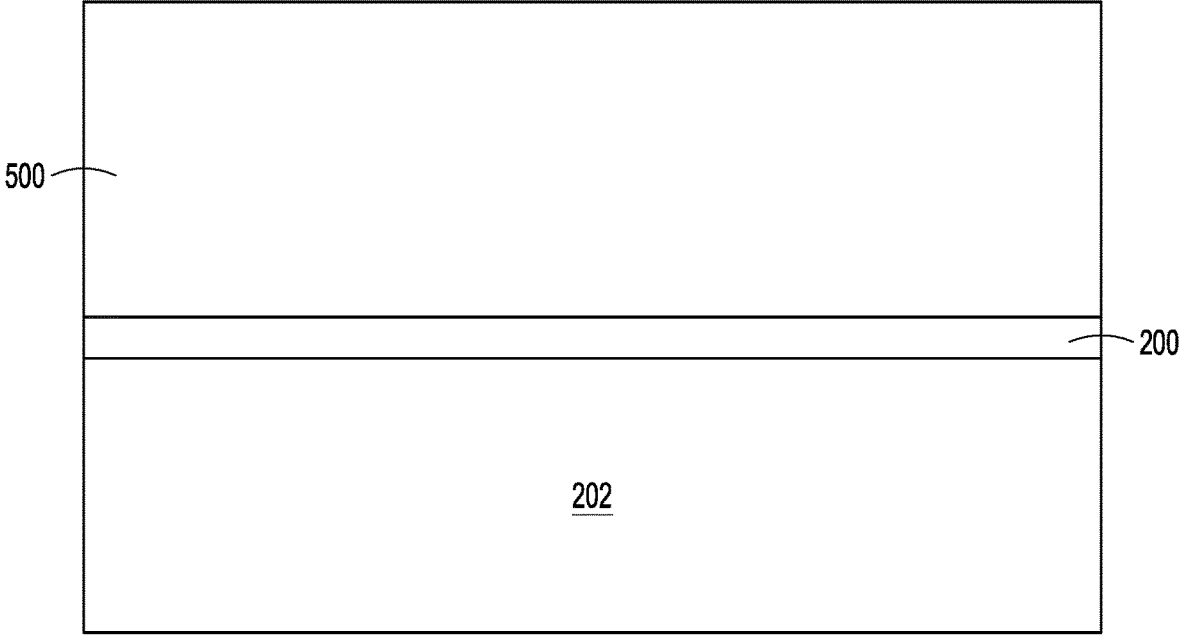
FIG. 5 shows a sealant that can be formed over the coating in FIG. 2.

Now making reference to FIG. 4, a method 400 for forming a coating on a substrate is shown. The substrate can be any type of substrate and while examples are discussed herein as the substrate being translucent, examples in accordance with the method 400 are not restricted to translucent substrates. During an operation 402, a ZnS film can be grown on a surface of the substrate with a radio frequency (RF) sputtering process. While the method 400 discusses growing a ZnS film, in other examples, a surface of the substrate that is formed with ZnS can be activated with a RF sputtering process.

As an example of the method 400 and referred to herein as "the illustration," during the operation 402, the ZnS film 206 can be grown on the substrate surface 208 of the substrate 202. The ZnS film 206 can be grown with a RF sputtering process as detailed above using the target 302 to a thickness of about 0.5 microns.

While the ZnS film is being grown during the operation 402, the method 400 can perform an operation 404, where a metal dopant, such as molybdenum or tungsten, can be sputtered on to the substrate. The metal dopants can be sputtered at a concentration in a range between about $1 \times 10^{16}$ cm$^{-3}$ and about $1 \times 10^{20}$ cm$^{-3}$ using a HiPIMS process during the operation 404. Furthermore, the metal dopants can be sputtered onto the substrate at the same time that the ZnS film is being grown on the substrate such that the operations 402 and 404 can be simultaneously performed. As detailed above, using a HiPIMS process ionizes the metal dopants such that a coating that is formed with the grown ZnS film and the sputtered metal dopants can have a sheet resistance that is in a range of about 25 ohms/square to about 50 ohms/square. Thus, the metal dopants that are sputtered during the operation 404 can form a coating having these characteristics.

In examples, the concentration at which the metal dopants are sputtered can be proportional to a thickness of the ZnS film that is being formed on the surface of the substrate. As noted above, a ZnS film can be formed to have a thickness in a range between about 0.1 microns and about 1 micron. Moreover, a ZnS film can be formed to have a thickness in a range between about 20 microns to about 30 microns. A concentration of the metal dopants can be proportional to a thickness of the ZnS film. Thus, when the ZnS film is formed to be comparatively thin, i.e., between about 0.1 microns and about 1 micron, the metal dopant can be deposited at a first concentration, such as in a range between about $1 \times 10^{18}$ cm$^{-3}$ and about $1 \times 10^{20}$ cm$^{-3}$ during the operation 404. Conversely, when the ZnS film is formed to be comparatively thick, i.e., between about 20 microns and about 30 micron, the metal dopant can be deposited at a second concentration higher than the first concentration, such as in a range between about $1 \times 10^{16}$ cm$^{-3}$ and about $1 \times 10^{17}$ cm$^{-3}$ during the operation 404.

Returning to the illustration, during the operation 404, the metal dopants 204 can be sputtered onto the substrate 202 at a concentration in a range between about $1 \times 10^{18}$ cm$^{-3}$ and about $1 \times 10^{20}$ cm$^{-3}$ since the ZnS film is being formed to a thickness of about 0.5 microns.

After the method 400 completes the operation 404 and a coating is formed over a substrate, the method 400 performs an operation 406, where the coating having the ZnS film and the metal dopants is sealed. In the illustration, during the operation 406, a coating 500 that includes barium copper sulfur fluoride (BaCuSF) is formed over the coating 200.

During the operation 402, a ZnS film is grown using the target 302 and a RF sputtering process. In further examples, growing a ZnS film can be replaced with activating ZnS that is disposed at the substrate surface 208. In this example, the operations 404 and 406 would still be performed as discussed above with the principal difference relating to activating ZnS to from the coating instead of growing a ZnS film.

Additional Examples

Example 1 is a method for forming a coating on a substrate, the substrate being formed from zinc sulfide (ZnS), the method comprising: growing a ZnS film on a surface of the substrate with a radio frequency (RF) sputtering process; and sputtering metal dopants on the substrate at a concentration between $1\times10^{16}$ cm$^{-3}$ and $1\times10^{20}$ cm$^{-3}$ with a high-power impulse magnetron sputtering (HiPIMS) process, wherein: the metal dopants are one of molybdenum or tungsten; the metal dopants are simultaneously sputtered while growing the ZnS film; the sputtering ionizes the coating such that the coating has a sheet resistance that is less than 50 ohm/square and the metal dopants form n-type dopants in the ZnS film; and the concentration at which the metal dopants are sputtered varies with a thickness of the ZnS film such that at a first ZnS film thickness, the concentration is at a first concentration and at a second ZnS film thickness that is greater than the first ZnS film thickness, the concentration is at a second concentration that is less than the first concentration.

In Example 2, the subject matter of Example 1, includes, wherein the first concentration of the metals of the dopants is in a range between $1\times10^{18}$ cm$^{-3}$ and $1\times10^{20}$ cm$^{-3}$ when the first thickness of the ZnS film is less than 1 micron.

In Example 3, the subject matter of Examples 1 and 2, includes, wherein the second concentration of the metals of the dopants is in a range between $1\times10^{16}$ cm$^{-3}$ and $1\times10^{18}$ cm$^{-3}$ when the second thickness of the ZnS film is greater than 1 micron.

In Example 4, the subject matter of Examples 1-3 includes, wherein the coating is a transparent coating and is configured to allow detection of infrared signatures through the coating and the ZnS substrate.

In Example 5, the subject matter of Example 4 includes, wherein the coating and the substrate form a window for a vehicle having a detector that allows for the detection of optical signals and thermal signatures through the window and into an interior of the vehicle.

In Example 6, the subject matter of Examples 1-5 includes, adding a p-type conductive coating on the coating of the substrate.

In Example 7, the subject matter of Example 6 includes, wherein the coating is barium copper sulfur fluoride.

Example 8 is a method for forming a coating on a substrate, the substrate being formed from zinc sulfide (ZnS), the method comprising: activating a surface ZnS at the substrate with a radio frequency (RF) sputtering process; and sputtering metal dopants on the substrate at a concentration between $1\times10^{16}$ cm$^{-3}$ and $1\times10^{20}$ cm$^{-3}$ with a high-power impulse magnetron sputtering (HiPIMS) process, wherein: the metal dopants are one of molybdenum or tungsten; the metal dopants are sputtered during activation of the ZnS surface; the sputtering ionizes the coating such that the coating has a sheet resistance that is less than 50 ohm/square and the metal dopants form n-type dopants in the ZnS surface; and the concentration at which the metal dopants are sputtered varies with a thickness of the ZnS surface such that at a first ZnS surface thickness, the concentration is at a first concentration and at a second ZnS surface thickness that is greater than the first ZnS surface thickness, the concentration is at a second concentration that is less than the first concentration.

In Example 9, the subject matter of Example 8 wherein the first concentration of the metals of the dopants is in a range between $1\times10^{18}$ cm$^{-3}$ and $1\times10^{20}$ cm$^{-3}$ when the first thickness of the ZnS surface is less than 1 micron.

In Example 10, the subject matter of Examples 8 and 9 includes wherein the second concentration of the metals of the dopants is in a range between $1\times10^{16}$ cm$^{-3}$ and $1\times10^{18}$ cm$^{-3}$ when second thickness of the ZnS surface is greater than 1 micron.

In Example 11, the subject matter of Examples 8-10 includes, wherein the coating is a transparent coating and is configured to allow detection of optical signals through the coating and the ZnS substrate.

In Example 12, the subject matter of Example 11 includes, wherein the coating and the substrate form a window for a vehicle having a detector that allows for the detection of optical signals and thermal signatures through the window and into an interior of the vehicle.

In Example 13, the subject matter of Examples 8-12 includes, adding a p-type conductive coating on the coating of the substrate.

In Example 14, the subject matter of Example 13 includes, wherein the coating is barium copper sulfur fluoride.

Example 15 is a method for forming a coating on a substrate, the substrate being formed from zinc sulfide (ZnS), the method comprising: growing a ZnS film on a surface of the substrate with a radio frequency (RF) sputtering process; and sputtering metal dopants on the substrate at a concentration between $1\times10^{16}$ cm$^{-3}$ and $1\times10^{20}$ cm$^{-3}$ with a high-power impulse magnetron sputtering (HiPIMS) process, the metal dopants being simultaneously sputtered while growing the ZnS film where the sputtering ionizes the coating.

In Example 16, the subject matter of Example 15 includes, the concentration at which the metal dopants are sputtered varies with a thickness of the ZnS film such that at a first ZnS film thickness, the concentration is at a first concentration and at a second ZnS film thickness that is greater than the first ZnS film thickness, the concentration is at a second concentration that is less than the first concentration.

In Example 17, the subject matter of Example 16 includes wherein the first concentration of the metals of the dopants is in a range between $1\times10^{18}$ cm$^{-3}$ and $1\times10^{20}$ cm$^{-3}$ when the first thickness of the ZnS film is less than 1 micron.

In Example 18, the subject matter of Examples 16-17 includes, wherein the second concentration of the metals of the dopants is in a range between $1\times10^{16}$ cm$^{-3}$ and $1\times10^{18}$ cm$^{-3}$ when second thickness of the ZnS film is greater than 1 micron.

In Example 19, the subject matter of Examples 15-18 includes, ohm/square and the metal dopants form n-type dopants in the ZnS film and the metal dopants are one of molybdenum or tungsten.

In Example 20, the subject matter of Examples 15-19 includes, adding a p-type conductive coating that includes barium copper sulfur fluoride on the coating of the substrate.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Although teachings have been described with reference to specific example teachings, it will be evident that various modifications and changes may be made to these teachings without departing from the broader spirit and scope of the teachings. Accordingly, the specification and drawings are to be regarded in an illustrative rather than a restrictive sense. The accompanying drawings that form a part hereof, show by way of illustration, and not of limitation, specific teachings in which the subject matter may be practiced. The teachings illustrated are described in sufficient detail to enable those skilled in the art to practice the teachings disclosed herein. Other teachings may be utilized and derived therefrom, such that structural and logical substitutions and changes may be made without departing from the scope of this disclosure. This Detailed Description, therefore, is not to be taken in a limiting sense, and the scope of various teachings is defined only by the appended claims, along with the full range of equivalents to which such claims are entitled.

What is claimed is:

1. A method for forming a coating on a substrate, the method comprising:

growing a zinc sulfide (ZnS) film on a surface of the substrate with a radio frequency (RF) sputtering process; and sputtering metal dopants on the substrate at concentrations between $1\times10^{16}$ cm$^{-3}$ and $1\times10^{20}$ cm$^{-3}$ with a high-power impulse magnetron sputtering (HiPIMS) process, wherein:

the metal dopants are ionized and one of molybdenum or tungsten;

the metal dopants are simultaneously sputtered with a RF sputtering process while growing the ZnS film, wherein:

the RF sputtering process and HiPIMS process are simultaneously performed such that the ZnS film is grown on the substrate during the RF sputtering process; and the HiPIMS process is performed such that the ionized metals dopants are interspersed in the ZnS film as the ZnS film is grown on the substrate;

the sputtering the metal dopants ionizes the coating on the substrate such that the coating has a sheet resistance that is less than 50 ohm/square and the metal dopants form n-type dopants in the ZnS film; and the concentrations at which the metal dopants are sputtered varies with a thickness of the ZnS film such that at a first ZnS film thickness, there is a first concentration and at a second ZnS film thickness that is greater than the first ZnS film thickness, there is a second concentration that is less than the first concentration where the second ZnS film thickness is separate from the first ZnS film thickness, wherein:

the ZnS film is formed in a stepwise fashion to achieve the first and second film thicknesses with corresponding gradient concentrations of the metal dopants distributed throughout the coating; and the greater thickness of the second ZnS film dilutes the metal dopants throughout the coating thereby allowing for a lower concentration of the metal dopants.

2. The method of claim 1, wherein the first concentration of metals of the metal dopants is in a range between $1\times10^{18}$ cm$^{-3}$ and $1\times10^{20}$ cm$^{-3}$ when the first ZnS film thickness is less than 1 micron.

3. The method of claim 1, wherein the second concentration of metals of the metal dopants is in a range between $1\times10^{16}$ cm$^{-3}$ and $1\times10^{18}$ cm$^{-3}$ when the second ZnS film thickness is greater than 1 micron.

4. The method of claim 1, wherein the coating is a transparent coating and is configured to allow detection of infrared signatures through the coating and the substrate.

5. The method of claim 4, wherein the coating and the substrate form a window for a vehicle having a detector that allows for the detection of optical signals and thermal signatures through the window and into an interior of the vehicle.

6. The method of claim 1, further comprising adding a p-type conductive coating on the coating of the substrate.

7. The method of claim 6, wherein the p-type conductive coating is barium copper sulfur fluoride.

* * * * *